United States Patent
Bahl (10) Patent No.: US 10,270,239 B2
(45) Date of Patent: Apr. 23, 2019

(54) OVERVOLTAGE PROTECTION AND SHORT-CIRCUIT WITHSTANDING FOR GALLIUM NITRIDE DEVICES

(71) Applicant: Texas Instruments Incorporated, Dallas, TX (US)

(72) Inventor: Sandeep R. Bahl, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 290 days.

(21) Appl. No.: 15/182,696

(22) Filed: Jun. 15, 2016

(65) Prior Publication Data

US 2017/0365995 A1 Dec. 21, 2017

(51) Int. Cl.
| | | |
|---|---|---|
| H02H 9/04 | (2006.01) | |
| H02H 7/12 | (2006.01) | |
| H02H 1/00 | (2006.01) | |
| H02M 1/08 | (2006.01) | |
| H02M 1/32 | (2007.01) | |
| H03K 17/082 | (2006.01) | |

(52) U.S. Cl.
CPC ........ *H02H 7/1213* (2013.01); *H02H 1/0007* (2013.01); *H02H 9/04* (2013.01); *H02M 1/08* (2013.01); *H02M 1/32* (2013.01); *H03K 17/0822* (2013.01); *Y02B 70/1483* (2013.01)

(58) Field of Classification Search
USPC .......................... 361/86–87, 91.1, 93.7–93.9
See application file for complete search history.

(56) References Cited

U.S. PATENT DOCUMENTS

| | | | |
|---|---|---|---|
| 6,987,378 B1 * | 1/2006 | Steele | H02M 1/32 |
| | | | 323/222 |
| 8,629,027 B1 | 1/2014 | Bulucea et al. | |
| 8,723,226 B2 | 5/2014 | Bahl | |
| 2006/0152205 A1 * | 7/2006 | Tang | H02M 3/1584 |
| | | | 323/284 |
| 2007/0114983 A1 * | 5/2007 | Weng | H02M 3/1563 |
| | | | 323/282 |
| 2014/0374766 A1 | 12/2014 | Bahl et al. | |

(Continued)

FOREIGN PATENT DOCUMENTS

| | | |
|---|---|---|
| RU | 2275670 C1 | 4/2006 |
| WO | 9429961 A1 | 12/1994 |

OTHER PUBLICATIONS

Seeman et al., "Advancing Power Supply Solutions Through the Promise of GaN", Texas Instruments, Power Supply Solutions, Feb. 2015, 7 pgs.

(Continued)

*Primary Examiner* — Danny Nguyen
(74) *Attorney, Agent, or Firm* — Tuenlap Chan; Charles A. Brill; Frank D. Cimino (57) ABSTRACT

Disclosed examples include methods, integrated circuits and switch circuits including a driver circuit and a silicon transistor or other current source circuit coupled with a gallium nitride or other high electron mobility first transistor, where the driver operatives in a first mode to deliver a control voltage signal to the first transistor, and in a second mode in response to a detected overvoltage condition associated with the first transistor to control the current source circuit to conduct a sink current from the first transistor to affect a control voltage to at least partially turn on the first transistor.

19 Claims, 8 Drawing Sheets

(56) References Cited

U.S. PATENT DOCUMENTS

2015/0137619 A1* 5/2015 Seeman .................. H02H 3/00
  307/116
2015/0303685 A1 10/2015 Wang et al.
2016/0049786 A1 2/2016 Kinzer

OTHER PUBLICATIONS

Mehta, "GaN FET Module Performance Advantage Over Silicon", Texas Instruments, Mar. 2015, 7 pgs.
"Using the LMG5200: GaN Half-Bridge Power Stage EVM", Texas Instruments, User's Guide, Literature No. SNVU461, Mar. 2015, 19 pgs.
"GaN Technology Preview: LMG5200 80-V, GaN Half-Bridge Power Stage", Texas Instruments, LMG5200, SNOSCY4B, Mar. 2015, Revised Jan. 2016, 23 pgs.
Aktas et al., "Avalanche Capability of Vertical GaN p-n Junctions on Bulk GaN Substrates", IEEE Electron Device Letters, vol. 36, No. 9, Sep. 2015, 3 pgs.
Liu et al., "Breakthroughs for 650-V GaN Power Devices", IEEE Power Electronics Magazine, Sep. 2015, 7 pgs.
Search Report for PCT/US2017/037733, dated Sep. 28, 2017 (1 page).
RU2275670C1, English Machine Translation, received Oct. 25, 2017 (6 pages).

* cited by examiner

OVERVOLTAGE PROTECTION AND SHORT-CIRCUIT WITHSTANDING FOR GALLIUM NITRIDE DEVICES

BACKGROUND

The present disclosure relates generally to switch circuits and overvoltage protection for switching devices. High electron mobility transistors (HEMTs) are becoming an attractive solution for high efficiency switching power supplies, amplifiers and other switch circuits due to low on-state resistance (e.g., RDSON). Compared with conventional silicon switching transistors, gallium nitride (GaN), aluminum gallium nitride (AlGaN), silicon carbide (SiC) and other HEMTs promise higher output power, lower size and high efficiency in power circuits, particularly at high frequencies. However, these technologies are in early stages of development, and generally have not displaced silicon solutions. Although well suited for high voltage power conversion applications, GaN transistors are susceptible to damage if biased into breakdown, as present GaN transistors do not have inherent avalanche capability commensurate with many silicon power FETs. Further, some silicon FETs also do not have inherent avalanche capability. In addition, many switch circuit applications require the ability to withstand short-circuit conditions, and current GaN fabrication techniques do not provide adequate short-circuit withstand ability. One technique to incorporate GaN or low inherent avalanche capability silicon transistors is to over design devices with excessive breakdown voltage margin, so that the transistor is never driven into breakdown. This approach is costly, and may subject the system to excessive voltages which would otherwise have been clamped with a silicon switch design.

SUMMARY

Disclosed example switch circuits include a driver and a current source circuit coupled with a gallium nitride or other transistors, and a driver circuit. In a first mode, the driver circuit delivers a control voltage signal to the first transistor. In a second mode, in response to a detected overvoltage condition associated with the first transistor, the driver circuit controls the current source circuit to conduct a sink current from the first transistor to turn on the first transistor. The current source facilitates discharging the overvoltage condition in a controlled manner. In certain examples, the driver operates in response to a detected overcurrent condition to control the current source to conduct current from the first transistor to limit current flow in the first transistor to enable short-circuit withstanding capability of the switch circuit without permanent damage to the first transistor. The current source in certain examples is a second transistor coupled with the first transistor in a cascode configuration. The second transistor in certain examples is fabricated in a silicon die along with the driver circuit and an overvoltage sense circuit. In other examples, the second transistor may also be fabricated monolithically along with the first transistor, or the first and second transistors can be monolithically integrated with the driver circuit. In the second mode, the driver provides a control voltage signal to operate the second transistor in a saturation mode to conduct a sink current from the first transistor and to affect a gate-source control voltage of the first transistor in the cascode configuration to at least partially turn on the first transistor. The driver circuit in certain examples implements an analog or digital control of the second transistor in responding to overvoltage conditions, and the second transistor is controlled according to the amount of overvoltage associated with the first transistor. Disclosed examples can be used in half bridge or other high side/low side power converter configurations to facilitate the use of GaN or other transistor switches for high efficiency systems while providing overvoltage and short-circuit withstand capability.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

Figure 1:
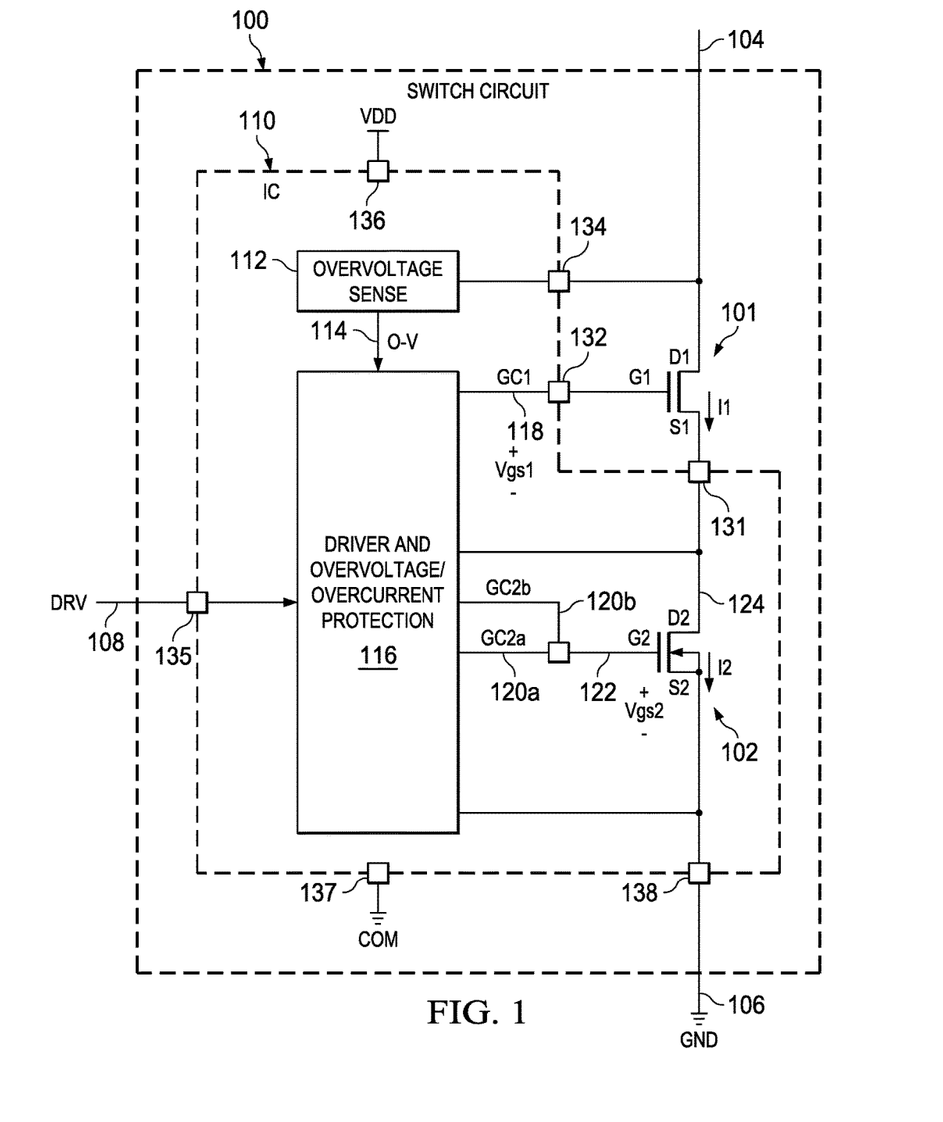
FIG. 1 is a schematic diagram of a switch circuit including a gallium nitride high electron mobility transistor and an integrated circuit including a driver and a low voltage silicon transistor.

FIG. 1 shows a switch circuit 100 including a first transistor 101 coupled in series with a second transistor 102 to form a switch circuit between a first circuit node 104 (e.g., a supply voltage node) and a second circuit node 106 (e.g., ground node GND or the switched node in a high-side configuration). The first transistor 101 in one example is a gallium nitride transistor (e.g., GaN, AlGaN, etc.). In other examples, the first transistor 101 can be a silicon (Si) silicon carbide (SiC) transistor or other PET. The second transistor 102 in this example is a low voltage silicon transistor that provides a current source to selectively conduct sink current I2 from the first transistor 101 to the second circuit node 106 in response to detection of overvoltage and/or overcurrent conditions. In the illustrated example, the current source, including the second transistor 102, is fabricated in an integrated circuit (IC) 110 along with an overvoltage sense circuit 112 and a driver circuit 116. The driver circuit 116 operates the first and second transistors 101 and 102 in multiple modes to provide for normal switching operation as well as protection against overvoltage and/or overcurrent conditions. In other cases, the second transistor 102 and driver circuit 110 can be fabricated monolithically on the same substrate as that of the first transistor 101, e.g., all transistors being Si, GaN or SiC. In one example, the driver circuit 116 operates in a first mode (e.g., NORMAL mode), a second mode (OVERVOLTAGE) in response to detected overvoltage conditions associated with the first transistor 101, and a third mode (OVERCURRENT) in response to detected overcurrent conditions in the switching circuit 100. The overvoltage sense circuit 112 in one example senses a voltage of the first circuit node 104 and selectively provides an overvoltage detection signal O-V on a line 114 as an input to the driver circuit 116 when the sensed voltage exceeds a threshold level. The overvoltage detection signal O-V causes the driver circuit 116 to operate in the second mode in response to a detected overvoltage condition. The driver circuit 116 implements overvoltage/overcurrent protection by selective operation of the second transistor 102 to implement a current source in series with the first transistor 101 between the first and second circuit nodes 104, 106 as described further below.

The switch circuit 100 in one example can is a dual-die component including a GaN die to form the first transistor 101 and a silicon die to form the IC 110 including the driver circuit 116, the overvoltage sense circuit 112, and the current source including the second transistor 102. The switch circuit 100 can be a single dual-die product with suitable electrical connections for the first and second circuit nodes 104 and 106, as well as a drive signal input 108 to the driver circuitry 116 in order to receive a drive signal DRV from an external controller (not shown). In other implementations, the driver IC 110 can be a separate product for use with a connected HEMT transistor 101. The IC 110 has a number of pads or pins for electrical interconnection with external circuits. The IC 110 in one example includes a first pin or pad 131 for electrical coupling (e.g., direct or indirect electrical connection) with a first source terminal S1 of the first transistor 101, as well as a second pad 132 convey a first gate control voltage signal GC1 from an output 118 of the driver circuit 116 to a first gate control terminal G1 of the first transistor 101. The IC 110 also includes a pad 134 to allow electrical connection to a drain terminal D1 of the first transistor 101, as well as electrical connection to the first switch circuit node 104. The IC 110 in this example includes a pad 135 to allow the driver circuit 116 to receive the drive signal DRV from an external circuit, and the IC 110 includes a positive supply voltage pad 136 for connection to a supply voltage VDD, and a common connection pad 137 for connection to a supply reference node COM. In addition, the IC 110 includes a pad 138 for connection to the switch circuit ground node 106 (GND). In another example, the IC 110 can monolithically include the first transistor 101, particularly in a high-voltage silicon, GaN, or SiC IC process, to form a single-die chip.

Figure 5:
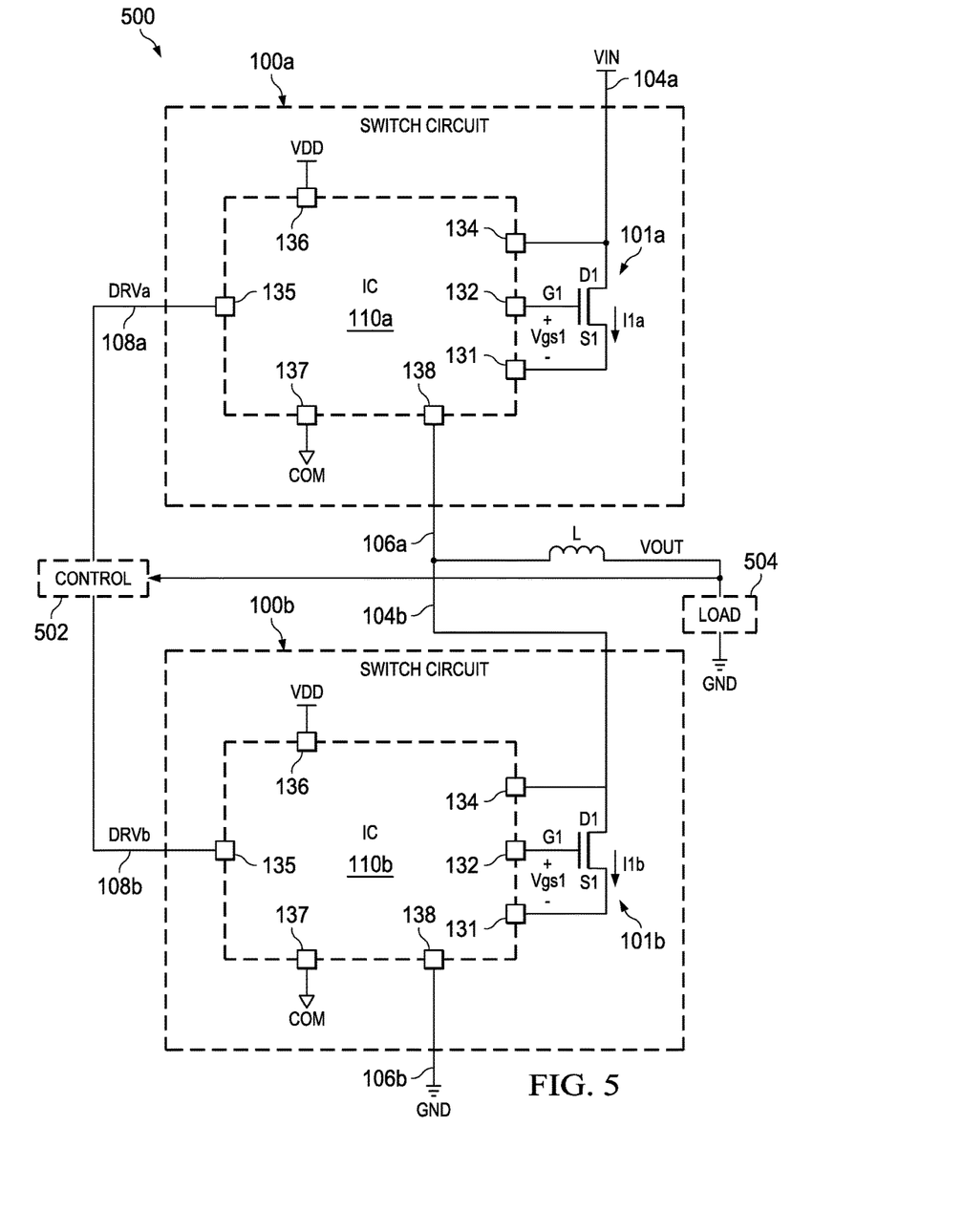
FIG. 5 is a schematic diagram of a half bridge power circuit using high and low side gallium nitride transistors and corresponding driver integrated circuits forming a DC-DC power converter with overvoltage and overcurrent protection.

The switch circuit 100 can be configured in any suitable power electronics circuitry, such as half or full bridge switching circuits, a multiphase inverter, etc., to implement a power conversion system. In one example, as illustrated in FIG. 5 below, a pair of switch circuits 100 can be connected in series with one another, with a switching node joining the switch circuits 100, in combination with an inductor to form a DC-DC converter circuit or half bridge converter to drive a load. The drive signal input 108 for each such switch circuit 100 can be provided with a pulse width modulated control signal DRV for corresponding high side or low side switching to provide DC-DC conversion. In other examples, multiple switch circuits 100 can be interconnected to form a single or multiphase inverter to drive an AC load by corresponding pulse width modulated DRV signals provided to the individual switch circuits 100.

The first transistor 101 in FIG. 1 is a GaN field effect transistor (FET) with a first drain terminal D1 connected to the first circuit node 104, a first source terminal S1 connected to the second transistor 102 via the first pad 131 of the IC 110, and a first control terminal (e.g., gate) G1 connected to receive the first gate control signal GC1 from the driver circuit 116 via the IC pad 132. The driver circuit 116 provides the control signal GC1 in one example according to the DRV signal received at the input 108 in the first (e.g., NORMAL) mode for controlled switching of the first transistor 101. In certain implementations, the driver circuit 116 continues to provide the GC1 signal according to the DRV signal in the second (e.g., OVERVOLTAGE) mode. In other implementations, the driver circuit 116 provides the signal GC1 to set the voltage of the first gate terminal G1 to a constant voltage (e.g., 0 V) in the second mode. In one example, the driver circuit 116 operates in the second mode in response to a detected overvoltage condition associated with the first transistor 101 to control the second transistor 102 in a saturation mode to operate as a current source to conduct a sink current I2 from the first source terminal S1 to the second circuit node 106. The controlled operation of the current source 102 sinking current I2 from the first source terminal S1 causes the first transistor 101 to self-adjust the first gate-source voltage Vgs1 to control the current I1 flowing in the first transistor 101 to match the current I2 flowing in the current source transistor 102. In this manner, the controlled operation of the current source transistor 102 affects the gate-source control voltage Vgs1 to at least partially turn on the first transistor 101.

In other examples, the driver circuit 116 provides one or more second control voltage signals GC2 (e.g., GC2a and GC2b in the example of FIG. 1) along corresponding lines 120a and 120b to the second transistor 102 according to the DRV signal in the first mode, while holding the GC1 signal to provide a constant voltage at the gate G1 of the first transistor 101 during normal switching operation of the switch circuit 100. In this regard, the first and second transistors 102 can be operated as a safety cascode configuration or as a traditional cascode combination during the first (e.g., NORMAL) operating mode The second transistor 102 in this example is a low voltage silicon FET transistor formed in a silicon die of the IC 110 to implement a controlled current source in series with the first transistor 101. In this case, the second transistor 102 includes a second drain terminal D2 coupled with the first source terminal S1, a second source terminal S2 coupled with the second circuit node 106, and one or more second control terminals (e.g., gate terminals) G2. The second drain terminal D2 is connected via a line 124 and the first pad 131 to the source terminal S1 of the first transistor 101. The driver circuit 116 is connected to the floating node 124 connecting the source S1 of the first transistor 101 to the drain D2 of the second transistor 102 for detecting short circuit conditions associated with the switch circuit 100.

In the second and third modes, the driver circuit 116 delivers the second control voltage signal GC2 to the gate G2 to turn on the second transistor 102 to conduct the sink current I2 current from the first source terminal S1 to the second circuit node 106 to limit the current T1 flowing in the first transistor 101. In certain examples, the driver circuit 116 provides the control voltage signal(s) GC2 according to the amount of overvoltage associated with the first transistor 101. For example, the driver circuit 116 can provide a single signal GC2 to a single gate of the second transistor 102 in the second mode as an analog voltage signal with an amplitude controlled according to the amount of overvoltage associated with the first transistor 101. In other examples, multiple second transistors 102 can be connected in parallel with one another between the first transistor 101 and the second circuit node 106, and the driver circuit 116 provides individual gate control signals to the gate control terminals of the second transistors 102 in order to implement digital control to set the sink current I2. In other non-limiting examples, as described further below in connection with FIG. 2, the second transistor 102 includes multiple gate control structures, which can be interleaved with one another in certain implementations for improved thermal heat-spreading. In such examples, the driver circuit 116 provides separate control signals (e.g., GC2a and GC2b in FIG. 1; CG2a, GC2b and GC2c in FIG. 4) to implement digital control of the sink current I2 according to the amount of overvoltage associated with the first transistor 101. In certain embodiments, the drive circuit 116 operates the second transistor(s) 102 in a linear mode during the first operating mode to set the on-state impedance of the second transistor 102 (e.g., RDSON) to a low value for normal operation, and operates the second transistor or transistors 102 in a saturation mode to implement a current source in the second and third operating modes to address overvoltage and/or overcurrent conditions in the switch circuit 100.

Figure 2:
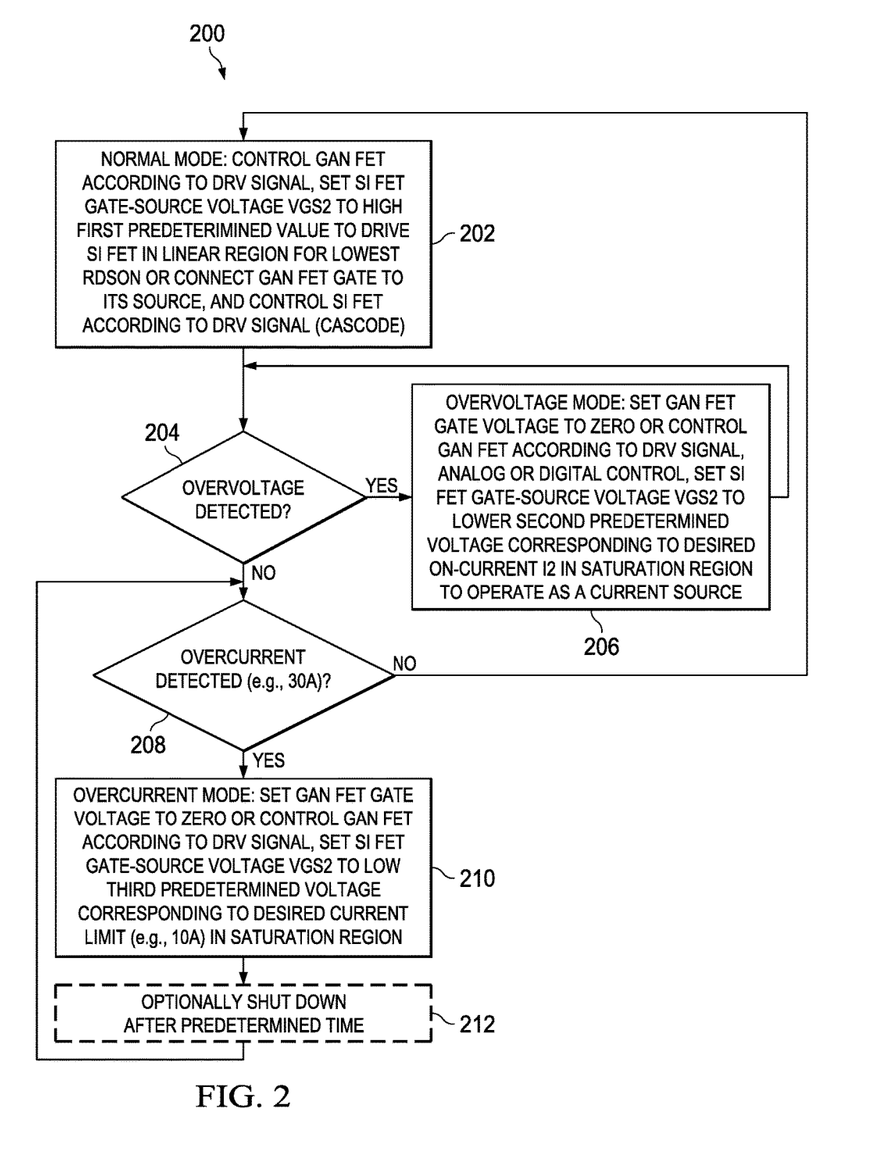
FIG. 2 is a flow diagram of a process for controlling a switch circuit implemented in the integrated circuit of FIG. 1.
Figure 3:
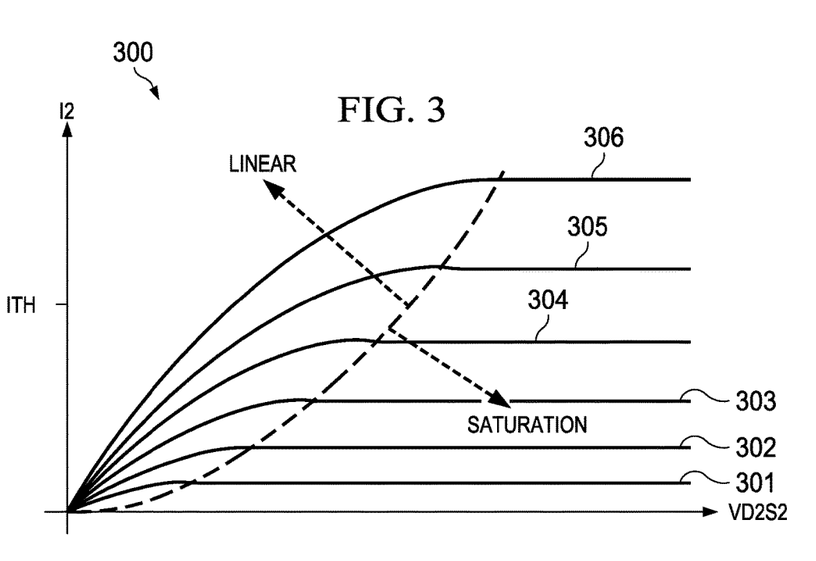
FIG. 3 is an output characteristic diagram illustrating operation of the low voltage silicon transistor in the integrated circuit of FIG. 1.

Referring now to FIGS. 2 and 3, FIG. 2 shows a process or method 200 for operating the switch circuit which can be implemented in the IC 110 in one example, and FIG. 3 illustrates a graph 300 including curves 301-306 showing linear and saturation region operation of the second transistor 102. In one possible implementation, the driver and overvoltage/overcurrent protection circuit 116 in FIG. 1 includes suitable logic, programmable or otherwise, to implement the process 200 of FIG. 2.

Normal mode operation is implemented in the first mode at 202, in which the driver circuit 116 delivers the signal GC1 to control the first transistor (e.g., GaN) according to the DRV signal. In this example, the driver circuit 116 provides the second control signal or signals GC2 to set Vgs2 to a relatively high first predetermined value. In one embodiment, the predetermined value is set to drive the second transistor 102 (Si FET) in a linear region to provide a minimal or relatively low RDSON to provide a low impedance between the first transistor 101 and the second circuit node 106. This minimizes the power consumption of the second transistor 102 in normal operation, thereby facilitating efficient operation of the switch circuit 100. In this example, the first transistor 101 operates as the circuit switch according to the DRV signal, and most of the switch circuit voltage drop between the circuit nodes 104 and 106 is across the first transistor 101 when the switch 101 is off. In certain examples, therefore, the second transistor 102 can be a low voltage silicon transistor, and the first transistor 101 is designed to accommodate the expected operating voltages and currents of a power conversion system or other host system in which the switch circuit 101 is employed.

In another example at 202 in the first (NORMAL) mode, the driver circuit 116 provides the control signal GC1 to ground the first transistor gate G1 (or to set the voltage of the gate G1 to another constant voltage such as with reference to its source or the switching node 131 in FIG. 1), and the circuit 116 provides the control signal or signals GC2 in order to control the second transistor 102 according to the DRV signal.

A determination is made at 204 as to whether an overvoltage condition has been sensed or detected. In one example, the overvoltage sense circuit 112 measures or senses the voltage at the first circuit node 104 (e.g., the drain D1 of the first transistor 101), and compares the voltage at the node 104 with a threshold voltage (not shown) at 204 in FIG. 2. For example, the overvoltage sense circuit 112 in one example determines whether the voltage across the first transistor 101 is greater than the threshold value. If no overvoltage condition exists (NO at 204), the driver circuit 116 determines at 208 whether an overcurrent condition has been detected. If no overvoltage or overcurrent conditions are detected (NO at 204 and 208), the driver circuit 116 continues normal operation at 202 as previously described.

If an overvoltage condition associated with the first transistor 101 is detected (YES at 204), the driver circuit 116 operates in the second mode at 206. In one example, in response to the overvoltage detection signal O-V from the sense circuit 112, the driver circuit 116 controls the current source by providing the signal(s) GC2 at 206 to cause the transistor 102 to conduct a non-zero sink current I2 from the first transistor 101 to the second circuit node 106. This controlled sink current I2 affects the voltage Vgs1 and causes the first transistor 101 to at least partially turn on. In one example at 206, the driver circuit 116 controls the transistor current source 102 according to the amount of overvoltage associated with the first transistor 101 using analog or digital control. In one example, the driver circuit 116 sets the gate voltage to zero or another constant value via the signal GC1 to control the first transistor 101 at 206. In other examples, the driver circuit 116 continues to deliver the gate control signal GC1 according to the DRV signal in the second mode.

The graph 300 in FIG. 3 shows curves 301-306 corresponding to different gate-source voltages Vgs2 in linear and saturation modes or regions for operation of the second transistor 102. In certain examples, the driver circuit 116 provides one or more gate control signals GC2 to control the gate-source voltage Vgs2 of the transistor 102 in the linear region in the first mode at 202 at a first predetermined value set according to a desired low on state resistance (e.g., low RDSON). For example, the driver circuit 116 in the first normal mode operation may provide a gate-source corresponding to the curve 306 at a relatively low drain-source voltage VD2S2 having a fairly high slope in the linear region of FIG. 3, while the first transistor 101 (FIG. 1) is operated according to the DRV signal. Curves 305, 304, 303, 302 and 301 correspond to successively lower gate-source voltages Vgs2 of the transistor 102. In the second mode, in response to detected overvoltage conditions, the driver circuit 116 the in one example lowers the second gate control signal or signals GC2 in order to operate the second transistor 102 at a lower gate-source voltage Vgs2, for example, in the saturation region along the curve 303. Operation in the second mode in the saturation region advantageously controls the second transistor 102 as a current source to sink current I2 out of the source S1 of the first transistor 101. This facilitates discharge of the overvoltage condition, with the sink current I2 affecting the first transistor gate-source voltage Vgs1, causing the first transistor 101 to self-adjust its operation to conduct the same amount of current (e.g., I1 is approximately equal to I2). In this manner, the driver circuit 116 controls the amount of overvoltage discharge current by setting the gate voltage of the second transistor 102 to a lower second predetermined voltage corresponding to the desired on-current I2 in the saturation region.

Returning to the process 200 in FIG. 2, the driver circuit 116 continues to monitor the overvoltage detection signal O-V from the overvoltage sense circuit 112 at 204, and continues operation in the second mode while the overvoltage condition remains. If the overvoltage condition is cleared (NO at 204), the overvoltage sense circuit 112 discontinues the signal O-V, and the driver circuit 116 determines at 208 whether an overcurrent condition is detected. In one example, the driver circuit 116 compares the voltages at the nodes 104 and 124 to determine whether a short circuit condition has been detected, indicating an overcurrent condition in the switch circuit 100. In another example, the voltage between nodes 124 and 138 is compared. This determination in one example corresponds to determining whether the current I1 exceeds a threshold current ITH shown in the graph 300 of FIG. 3. If not (NO at 208), the process 200 returns to normal operation in the first mode at 202 as previously described.

If an overcurrent condition has been detected (YES at 208), the driver circuit 116 begins operation in a third (e.g., OVERCURRENT) mode. In one example, the driver circuit 116 sets the gate voltage of the first transistor 101 at 210 to zero or another constant voltage. In other examples, the driver circuit 116 continues to control the gate voltage of the first transistor 101 according to the DRV signal at 210. In the third mode, the driver circuit 116 controls the second transistor gate-source voltage Vgs2 to a low third predetermined voltage for operating the transistor 102 in the saturation mode or region. The selected gate-source voltage corresponds to a desired current limit, for example, along the curve 305 slightly above the threshold level ITH in one implementation. In certain implementations, the driver circuit 116 maintains operation at 210 for a predetermined time (e.g., 10 μs), and then shuts down the switch circuit by turning off both transistors 101 and 102 at 212. In other implementations, the driver circuit 116 continues to monitor the presence or absence of an overcurrent condition at 208.

If the overcurrent condition is cleared (NO at 208), the driver circuit 116 returns for normal operation at 202 as described above. In this manner, the driver circuit 116 detects switch circuit current exceeding the threshold ITH when there is no overvoltage condition, corresponding to detection of a short circuit condition. In response to the detected overcurrent condition, the driver circuit 116 clamps the switch circuit 100 at a predetermined maximum current by operating the second transistor 102 in the saturation region to operate the switch circuit in a cascode configuration, and the driver circuit 116 can maintain this maximum current operation for a certain time to allow the possibility of the overcurrent condition clearing, or the driver circuit 116 may shut down the switch circuit 100 after a predetermined time. The IC 110 thus implements overcurrent protection for switch circuits 100 using GaN or other HEMT switching transistors 101 to meet any desired short circuit withstand rating, and also provides avalanche operation to protect the transistor 101 in overvoltage conditions, facilitating the use of switching transistors 101 that do not inherently provide avalanche behavior and short circuit withstand capability suitable to a given application.

Figure 4:
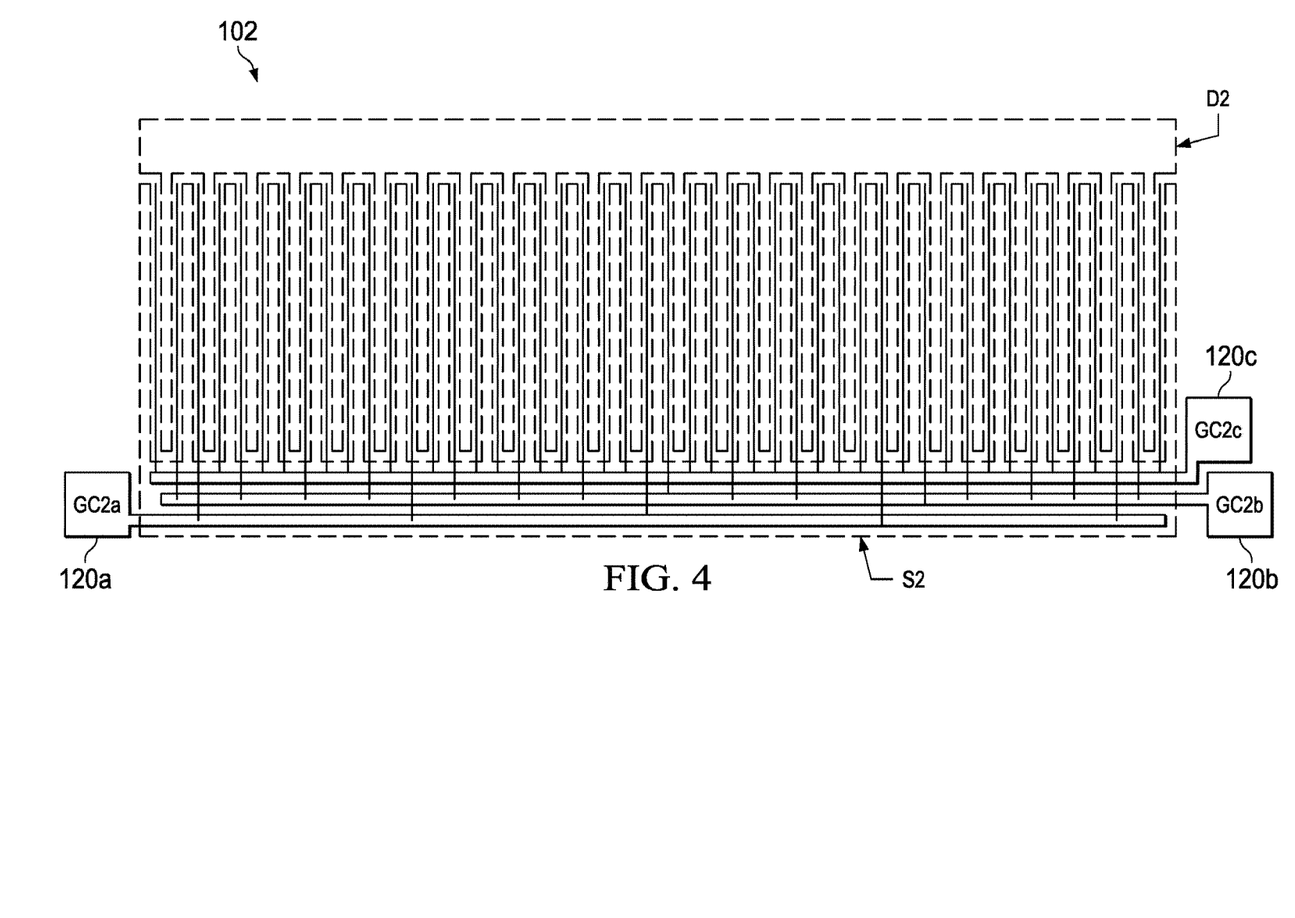
FIG. 4 is a simplified partial top plan view of an example low voltage silicon transistor with an interleaved multiple gate configuration providing digital control.

Referring also to FIG. 4, in one example the second transistor 102 is a silicon FET with a multiple gate construction allowing digital control by the driver circuit 116. FIG. 4 shows a simplified top view in which a drain structure D2 and a source structure S2 are formed in a silicon die or wafer, and first through third conductive gate structures 120a, 120b and 120c form an interleaved gate structure G2 overlying channel regions between fingers of the drain D2 and the source S2. In this example, the driver circuit 116 provides first, second and third gate control signals GC2a, GC2b and GC2c to the gate structures 120a, 120b and 120c, respectively, and the driver circuit 116 separately controls the voltage applied to the gate structures 120. The driver circuit 116 in one example separately implements analog control of the voltage applied to each of the gate structures 120a-120c, and can provide the gate control signals GC2a, GC2b and GC2c at individual voltages based at least in part on the amount of overvoltage detected in the second operating mode. In another example, the driver circuit 116 provides the gate control signals GC2a, GC2b and GC\2c at predetermined voltages, and separately drives none, one, or both of the gate structures 120a and 120b to implement digital control, with the digital or binary actuation of the multiple gate structure 120 implemented to control the operation of the second transistor 102 at least partially according to the amount of detected overvoltage associated with the first transistor 101 in the second mode. The driver circuit 116 can implement digital control to selectively turn on or shut off portions of the second transistor 102 in order to control the saturation current of the second transistor 102 for a given gate voltage. For example, the driver circuit 116 turns on one of the gate portions 120a or 120b to control operation of the switch circuit 100 to implement a controlled current source at a first current level I1/I2, and can turn on the other gate portion 122 implement a second higher current level I1/I2. The example of FIG. 4 and other interleaved embodiments advantageously interleave the gate structure portions 120a and 120b to reduce self-heating of the low voltage silicon transistor 102. The following Table 1 shows a digital control scheme example using three FET portions of different sizes, for example, as shown in FIG. 4.

TABLE 1

| segment | fill % | code | | | | | | | |
|---|---|---|---|---|---|---|---|---|---|
| 120a (GC2a) | 10 | 0 | 1 | 0 | 1 | 0 | 1 | 0 | 1 |
| 120b (GC2b) | 30 | 0 | 0 | 1 | 1 | 0 | 0 | 1 | 1 |
| 120c (GC2c) | 60 | 0 | 0 | 0 | 0 | 1 | 1 | 1 | 1 |
| % of 2ND FET 102 on | | 0 | 10 | 30 | 40 | 60 | 70 | 90 | 100 |

FIG. 5 shows another embodiment including a half bridge power conversion system or circuit 500 including first and second (e.g., high and low side) GaN transistors 101a and 101b and corresponding first and second driver ICs 110a and 110b in switch circuits 100a and 100b, respectively. The integrated circuits 110a and 110b individually include an overvoltage sense circuit 112, a driver and overvoltage/overcurrent protection circuit 116, and a low voltage silicon second transistor 102 as described above in connection with FIG. 1. An input voltage VIN is connected to the first circuit node 104a of the first switch circuit 100a, and this input voltage is provided to the terminal 134 of the first IC 110a and the drain D1 of the first transistor 101a of the first switch circuit 100a. The first transistor 101a of the first switch circuit 100a conducts a drain-source current I1a, and the internal second transistor of the IC 110a operates according to control signals from the corresponding driver circuit 116 in the first, second and third modes as described above. The first driver IC 110a includes a terminal 135 connected to receive a first drive control signal DRVa along a line 108a from a power conversion control circuit 502, and selectively operates the first transistor 101a or the internal second transistor 102 according to the drive signal DRVa in the first (e.g., NORMAL) mode as described above.

A second circuit node 106a associated with the first switch circuit 100a is connected from a pad 138 of the first driver IC 110a to a first circuit node 104b of the second switch circuit 100b to form a switch node in the power conversion circuit 500. An output inductor L is connected between the switch node 106a, 104b and a load 504. In normal operation, absent any overvoltage or overcurrent conditions, the first and second switch circuits 100a and 100b are operated respectively as high and low side switches to provide a DC output voltage VOUT across the load 504 with respect to a power converter ground node GND.

The second switch circuit 100b operates as a low side switch, and includes a driver IC 110b, and a first low side transistor 101b with a drain D1 connected to the switch node 104b and a source S1 connected to a pad 131 of the second driver IC 110b. The transistor 101b conducts a drain-source current I1b as shown, and the second driver IC 110b includes a driver circuit 116 and an internal second transistor 102 as described above in connection with FIG. 1. The source S2 of the internal second transistor 102 of the second driver IC 110b is connected to the ground node GND through a corresponding pad 138 and second circuit node 106b as shown in FIG. 5. The second switch circuit 100b receives a second drive signal DRVb along a line 108b from the control circuit 502.

In operation in one example, the control circuit 502 generates the drive signals DRVa and DRVb to provide alternate connection of the switch node 106a, 104b to the input voltage VIN or to the ground GND, with the relative on-times of the drive signals DRVa and DRVb regulating the output voltage VOUT provided to the load. The control circuit 502 receives a feedback signal representing the output voltage VOUT and selectively adjusts the pulse width modulation (e.g., on-times) of the drive signals DRVa and DRVb in a closed loop fashion to regulate the output voltage VOUT.

Figure 6:
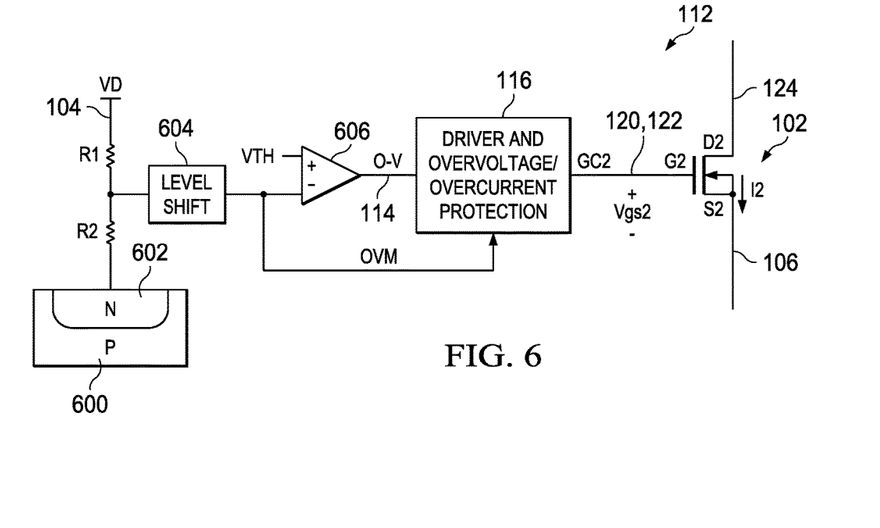
FIG. 6 is a partial schematic diagram of a circuit for sensing overvoltage conditions in the integrated circuit of FIG. 1.

Referring now to FIGS. 1, 5 and 6, the illustrated driver ICs 110 include an internal overvoltage sense or detection circuit 112. FIG. 6 shows an example overvoltage sense circuit 112 to sense overvoltage conditions associated with a connected first transistor 101. In this example, the avalanche capability of a silicon P-N junction formed between N and P regions of a silicon die used in forming the integrated circuit 110 is used along with a resistor circuit R1, R2 to detect overvoltage conditions associated with the switch circuit 100 and the first transistor 101 thereof. The first resistor R1 is connected to the first circuit node 104 at the drain (D1) of the first transistor 101 (e.g., FIG. 1), and the second resistor R2 is connected between R1 and the N-type doped region 602. The P-type doped region 600 can be formed using any suitable semiconductor fabrication techniques in a semiconductor body or wafer, such as implantation of P-type dopants in a silicon wafer. The N-type doped region 602 can be formed as an implanted well or other N-type doped region 602 having at least one boundary or junction with the P-type doped region 600 forming a P-N junction.

In operation, when the voltage VD exceeds a certain avalanche threshold associated with the silicon P-N junction 600/602, the avalanche behavior of the silicon die causes conduction through reverse biasing of the corresponding diode of the junction. Once this avalanche current flow reaches a certain threshold, set by the resistive divider circuit values of R1 and R2, the voltage at the node joining R1 and R2 will rise above a threshold level. In one example, the overvoltage sense circuitry 112 includes a level shift circuit 604, although this circuit 604 can be omitted in certain embodiments. For example, if the integrated circuit 110 includes a high voltage junction with low side substrate current I_sub access, the level shift circuit 604 is not needed. The circuit 112 in this example also includes a comparator circuit 606 with a first input (−) to receive a sense signal OVM representing the magnitude or amount of overvoltage directly from the node joining R1 and R2 or from an intervening level shift circuit 604 representing a voltage of a node joining the first and second resistors R1 and R2. A second comparator input (+) is connected to receive a threshold voltage signal VTH. The output of the comparator 606 delivers the overvoltage detection signal O-V to cause the driver circuit 116 to operate in the second mode when the sense signal exceeds the threshold voltage signal VTH. The circuit 116 in certain examples uses analog or digital control according to the overvoltage magnitude signal OVM to implement proportional analog or digital control.

Figure 7:
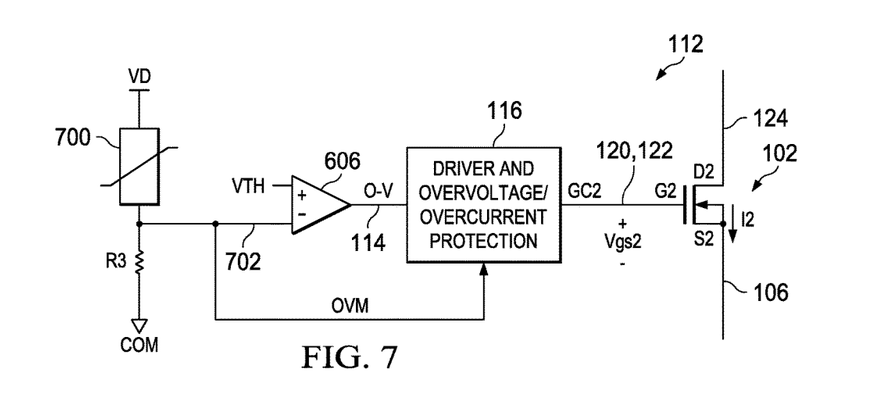
FIG. 7 is a partial schematic diagram of another example circuit for sensing overvoltage in the integrated circuit of FIG. 1.

FIG. 7 shows another example overvoltage sense circuit 112 for sensing overvoltage in the integrated circuits 110 of FIGS. 1 and 5. This example includes a varistor 700 (e.g., a metal oxide varistor or MOV) the connected between a lower level supply voltage (e.g., VDD in FIG. 1 above) and a node 702. In other examples, the varistor 700 can be replaced by a Zener diode (not shown). In this example, the overvoltage sense circuit 112 does not require a high voltage connection, but instead can be connected to a supply level of the IC 110 (e.g., VDD). In this regard, lightning or other source of overvoltage spikes will be reflected on the VDD supply voltage, and the circuit 112 uses this spike to detect overvoltage conditions associated with the first transistor 101 of the connected transistor 101 in the associated switch circuit 100. As seen in FIG. 7, a resistor R3 is connected between the node 702 and the associated common connection COM, and excessive voltages on the VDD node will cause conduction through the varistor or Zener diode 700. Such current flows through the resistor R3, and causes a voltage rise on the node 702. The circuit 112 in this example further includes a comparator circuit 606 with a first input (−) to receive a sense or overvoltage magnitude signal OVM representing the voltage of the node 702, a second input (+) to receive a threshold voltage signal VTH, and an output to deliver the overvoltage detection signal O-V to cause the driver circuit 116 to operate in the second mode OVERVOLTAGE when the sense signal exceeds the threshold voltage signal VTH.

Figure 8:
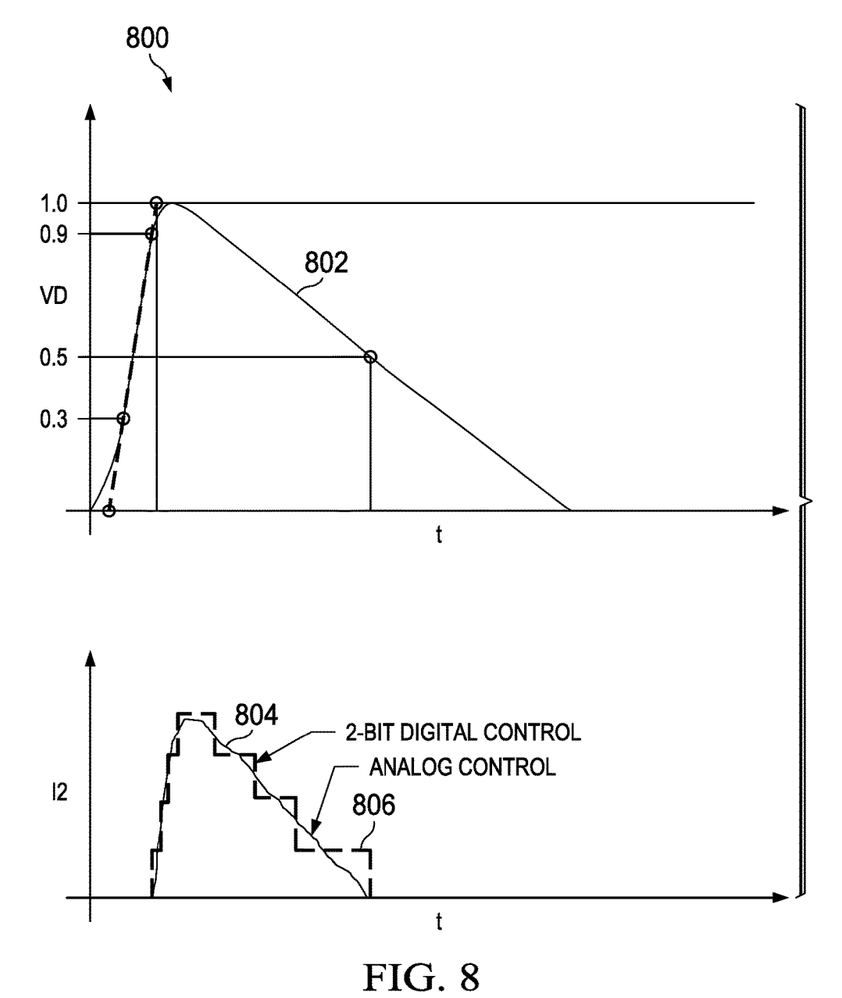
FIG. 8 is a waveform diagram illustrating an example overvoltage waveform and corresponding analog and digital gate control curves for the low voltage silicon transistor in the switch circuit of FIG. 1.

FIG. 8 shows a waveform or graph 800 illustrating an example overvoltage waveform 802 and corresponding analog and digital low voltage transistor gate control curves 804 and 806 to control the second transistor 102 in the switch circuit 100 of FIG. 1. In this example, the drain voltage VD of the first transistor 101 is brought to a peak or crest shown as a scaled value 1.0, and the curve 802 decreases over time for a combination wave generator CW G1.2/50 voltage surge test waveform according to an ANSI IEEE C62.41-

1991 transient overvoltage immunity test. The driver circuit 116 responds to detected overvoltage conditions associated with the first transistor 101 to control the second transistor 102 using analog or digital control in certain examples as described above. The curve 804 in FIG. 8 shows analog control of the second gate source voltage Vgs2 using the control signal GC2 in FIG. 1, where the driver circuit 116 adjusts the amplitude of the applied gate control signal GC2 over time at least partially according to the amount of overvoltage shown in the curve 802. A stepped curve 806 in FIG. 8 illustrates a 2-bit digital control implementation via the control signals GC2a and GC2b in FIG. 1, which also varies over time according to the overvoltage amount in the curve 802. Multi-value or digital control advantageously reduces ringing since the overvoltage mitigation is less sudden. In addition, digital control provides better ability to withstand process variability of the threshold voltage of the second transistor 102.

Figure 9:
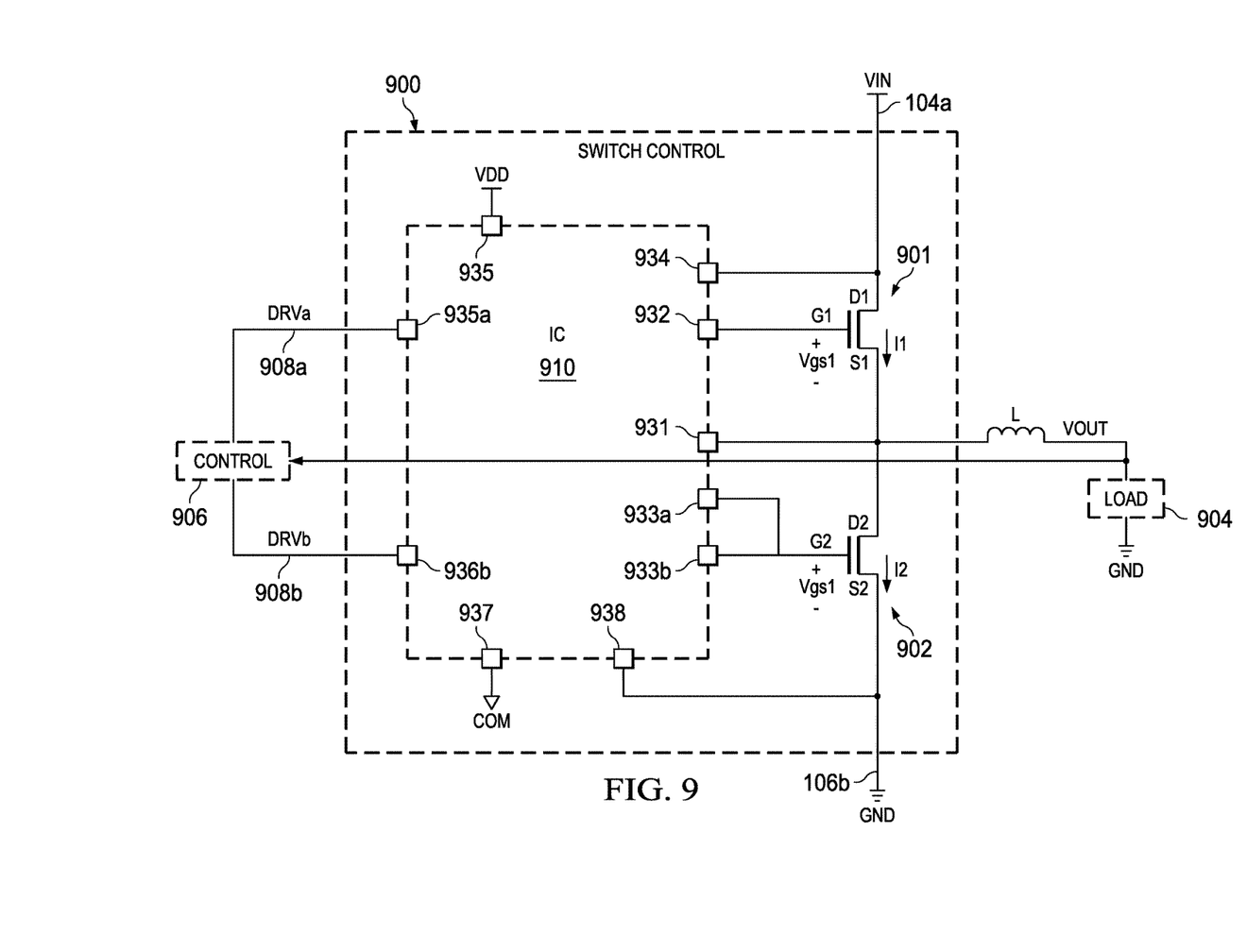
FIG. 9 is a schematic diagram of an example half bridge switch circuit including high and low side gallium nitride transistors and a driver integrated circuit to use the low side transistor for overvoltage and overcurrent protection.

FIG. 9 shows an example half bridge switch circuit 900 including high and low side gallium nitride transistors 901 and 902, as well as a driver IC 910 controlling the transistors 901 and 902. In this example, the transistors 901 and 902 are both GaN FETs or other HEMTs coupled in series with one another between an input voltage VIN at a first circuit node 104a and a power converter ground node GND at a second circuit node 106b. The low side transistor 902 in this example has an interleaved, two element control gate. A center node joins the transistors 901 and 902 to form a switching node connected to drive a load 904 through an output inductor L. The IC 910 receives first and second drive control signals DRVa and DRVb along lines 908a and 908b via IC pads 935a and 936b from a power conversion circuit controller 906. The IC 910 selectively operates the transistors 901 and 902 according to the drive signals DRVa and DRVb in a normal or first mode as previously described. In addition, the control circuit 906 in one example provides the drive signals DRVa and DRVb in alternating fashion to implement high side and low side operation of the first and second transistors 901 and 902 in order to regulate the output voltage VOUT provided to the load 904 in closed loop fashion. The IC 910 includes a pad 935 for connection to a supply voltage VDD, as well as a common connection pad 937. In addition, a pad 932 delivers a gate control signal to the gate G1 of the first transistor 901, first and second pads 933a and 933b provide one or more gate control signals to a gate G2 of the second transistor 902, and a pad 931 is connected to a switching node joining the source S1 of the first transistor 901, the drain D2 of the second transistor 902, and the output inductor L.

The IC 910 also includes overvoltage sense circuitry, such as the circuit 112 described above, to selectively detect overvoltage conditions associated with the switch circuit 900. In one example, the IC 910 includes a pad 934 connected to the drain D1 of the first transistor 901 to sense the voltage of the first transistor 901 and selectively detects whether an overvoltage condition exists. In response to detected overvoltage is associated with the switch circuit 900, the IC 910 controls the low side transistor 902 to operate as a current source or current clamp by turning on one or both of a pair of gate control terminals by providing corresponding gate control signals to output pads 933a and 933b. In operation, this causes the second transistor 902 to operate as a controlled current source in a second mode (OVERVOLTAGE) and/or in a third mode (OVERCURRENT) in response to a detected or sensed overvoltage or overcurrent condition in the switch circuit 900. In this manner, the IC 910 operates generally as described above in connection with FIG. 2 to provide multimode operation, with overvoltage and/or overcurrent protection provided by operation of the second transistor 902 as a controlled current source in a cascode configuration with the upper or first transistor 901.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A circuit, comprising:
a first transistor, including a first drain terminal coupled with a first circuit node, a first source terminal, and a first control terminal;
a current source circuit coupled between the first source terminal and a second circuit node; and
a driver circuit operative in a first mode to deliver a first control voltage signal to the first control terminal and to control a second transistor providing the current source circuit to operate in a linear mode, and in a second mode in response to a detected overvoltage condition associated with the first transistor to control the second transistor providing the current source circuit to operate as in a saturated mode to conduct a sink current from the first source terminal to the second circuit node to affect a control voltage between the first source terminal and the first control terminal to at least partially turn on the first transistor.

2. The circuit of claim 1, wherein the first transistor is a gallium nitride (GaN) field effect transistor (FET).

3. The circuit of claim 1, wherein the second transistor providing the current source circuit includes:
a second drain terminal coupled with the first source terminal,
a second source terminal coupled with the second circuit node, and
a second control terminal; and
wherein the driver circuit is operative in the second mode to deliver a second control voltage signal to the second control terminal to turn on the second transistor to conduct the sink current from the first source terminal to the second circuit node to limit a first current flowing in the first transistor.

4. The circuit of claim 3, wherein the driver circuit is operative in the second mode to provide the second control voltage signal to the second control terminal according to an amount of overvoltage associated with the first transistor.

5. The circuit of claim 3, wherein the second transistor includes multiple second control terminals; and wherein the driver circuit is operative in the second mode to provide multiple second control voltage signals to the second control terminals using digital control to turn on the second transistor according to an amount of overvoltage associated with the first transistor to turn on one or more subsections of the second transistor.

6. The circuit of claim 3, wherein the driver circuit and the second transistor are fabricated in a silicon die, and wherein the first transistor is fabricated in a second die using gallium nitride (GaN).

7. The circuit of claim 6, wherein the silicon die includes an overvoltage sense circuit to deliver an overvoltage detection signal to cause the driver circuit to operate in the second mode in response to detection of the overvoltage condition associated with the first transistor.

8. The circuit of claim 7, wherein the overvoltage sense circuit includes:
a P-type doped region of a silicon substrate of the silicon die;
an N-type doped region at least partially surrounded by the P-type doped region of the substrate of the silicon die;
first and second resistors connected in series with one another between the first circuit node and the N-type doped region;
a comparator circuit including a first input to receive a sense signal representing a voltage of a node joining the first and second resistors, a second input to receive a threshold voltage signal, and an output to deliver the overvoltage detection signal to cause the driver circuit to operate in the second mode when the sense signal exceeds the threshold voltage signal.

9. The circuit of claim 7, wherein the overvoltage sense circuit includes:
a varistor or Zener diode coupled between a first voltage node of the silicon die and an intermediate node;
a resistor coupled between the intermediate node and a second voltage node of the silicon die; and
a comparator circuit including a first input to receive a sense signal representing a voltage of the intermediate node, a second input to receive a threshold voltage signal, and an output to deliver the overvoltage detection signal to cause the driver circuit to operate in the second mode when the sense signal exceeds the threshold voltage signal.

10. The circuit of claim 7, wherein the overvoltage sense circuit, the driver circuit, the second transistor and the first transistor are fabricated monolithically.

11. The circuit of claim 3, wherein the driver circuit is operative in a third mode in response to a detected overcurrent condition associated with the first transistor to deliver a second control voltage signal to the second control terminal to operate the second transistor in a saturation mode to conduct the sink current from the first source terminal to the second circuit node to limit a first current flowing in the first transistor.

12. The circuit of claim 1, wherein the driver circuit is operative in a third mode in response to a detected overcurrent condition associated with the first transistor to control the current source circuit to conduct a sink current from the first source terminal to the second circuit node to limit a first current flowing in the first transistor.

13. A method of operating a switch circuit, the switch circuit including a first transistor connected to a first circuit node, and a current source connected between the first transistor and a second circuit node, the method comprising:
in a first mode, delivering a first control voltage signal to the first transistor according to a drive signal;
in the first mode, controlling a second transistor providing the current source to operate in a linear mode and provide a low impedance between the first transistor and the second circuit node; and
in a second mode, in response to detection of an overvoltage condition associated with the first transistor, controlling the second transistor providing the current source to operate in saturation to conduct a sink current from the first transistor to the second circuit node to at least partially turn on the first transistor.

14. The method of claim 13, further comprising, in the second mode, controlling the current source according to an amount of overvoltage associated with the first transistor.

15. The method of claim 13, further comprising, in the second mode, controlling the current source digitally to turn on one or more subsections of the second transistor.

16. The method of claim 13, further comprising, in a third mode, in response to detection of an overcurrent condition associated with the first transistor, controlling the current source to conduct the sink current from the first transistor to the second circuit node to limit a first current flowing in the first transistor.

17. An integrated circuit to control a switch circuit, the integrated circuit comprising:
a first pad to electrically couple with a first source terminal of a first transistor of the switch circuit;
a second pad to deliver a first control voltage signal to a first control terminal of the first transistor;
an overvoltage sense circuit to deliver an overvoltage detection signal in response to detection of an overvoltage condition associated with the first transistor; and
a driver circuit operative in a first mode to deliver the first control voltage signal to the second pad to control the first transistor, and in a second mode in response to the overvoltage detection signal to control a current source circuit to conduct a sink current from the first source terminal to affect a control voltage between the first pad and the second pad to at least partially turn on the first transistor;
wherein the current source circuit includes a second transistor formed in the integrated circuit, the second transistor including a second drain terminal coupled with the first pad, and a second control terminal; and
wherein the driver circuit is operative in the second mode to deliver a second control voltage signal to the second control terminal to turn on the second transistor to conduct the sink current from the first source terminal to limit a first current flowing in the first transistor.

18. The integrated circuit of claim 17, wherein the overvoltage sense circuit includes:
a P-type doped region of a silicon substrate of the integrated circuit;
an N-type doped region at least partially surrounded by the P-type doped region of the substrate of the integrated circuit;
first and second resistors connected in series with one another between the second pad and the N-type doped region;
a comparator circuit including a first input to receive a sense signal representing a voltage of a node joining the first and second resistors, a second input to receive a threshold voltage signal, and an output to deliver the overvoltage detection signal to cause the driver circuit to operate in the second mode when the sense signal exceeds the threshold voltage signal.

19. The integrated circuit of claim 17, wherein the overvoltage sense circuit includes:
a varistor or Zener diode coupled between a first voltage node of the integrated circuit and an intermediate node;
a resistor coupled between the intermediate node and a second voltage node of the integrated circuit; and
a comparator circuit including a first input to receive a sense signal representing a voltage of the intermediate node, a second input to receive a threshold voltage signal, and an output to deliver the overvoltage detection signal to cause the driver circuit to operate in the second mode when the sense signal exceeds the threshold voltage signal.

* * * * *